(12) United States Patent
Mellick et al.

(10) Patent No.: US 12,098,916 B1
(45) Date of Patent: Sep. 24, 2024

(54) TEMPERATURE SENSING ARRAYAL FOR FREEBOARD DETECTION

(71) Applicant: The United States of America, as represented by the Secretary of the Navy, Arlington, VA (US)

(72) Inventors: David A. Mellick, Hayden, ID (US); Steven O. Troxel, Hayden, ID (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 493 days.

(21) Appl. No.: 17/503,324

(22) Filed: Oct. 17, 2021

Related U.S. Application Data

(60) Provisional application No. 63/164,377, filed on Mar. 22, 2021.

(51) Int. Cl.
*G01B 21/08* (2006.01)
*G01K 1/02* (2021.01)
(Continued)

(52) U.S. Cl.
CPC .......... *G01B 21/085* (2013.01); *G01K 1/026* (2013.01); *G01K 3/14* (2013.01); *H05K 1/181* (2013.01);
(Continued)

(58) Field of Classification Search
None
See application file for complete search history.

(56) References Cited

U.S. PATENT DOCUMENTS

| 4,712,305 A | 12/1987 | Latham |
|---|---|---|
| 4,887,361 A | 12/1989 | Latham |

(Continued)

OTHER PUBLICATIONS

Baronti, F., et al., "A New and Accurate System for Measuring Cruising Yacht Freeboards With Magnetostrictive sensors," May 2011, IEEE Transactions on Instrumentation and Measurement, vol. 60, Issue 5, pp. 1811-1819 (Year: 2011).*

(Continued)

*Primary Examiner* — Natalie Huls
*Assistant Examiner* — Nyla Gavia
(74) *Attorney, Agent, or Firm* — Howard Kaiser

(57) ABSTRACT

An exemplary inventive freeboard detection system includes a tubular watertight temperature-sensing device and a computer. The temperature-sensing device includes a printed circuit board assembly (PCBA), a potting compound, and a hollow rigid tube. Inside the tube the potting compound encapsulates the PCBA, which includes a printed circuit board (PCB) and multiple temperature sensors closely and equidistantly arrayed along the length of the tube. The temperature-sensing device is vertically secured in a partially submerged state to a vessel with the expectation that some of the vertically arrayed temperature sensors will sense air temperature and others will sense water temperature. On an ongoing basis, the computer receives signals from the temperature sensors and processes the signals to monitor freeboard values, which the computer calculates based on differences in temperature measurements corresponding to pairs of consecutive (and/or nonconsecutive) temperature sensors. A maximum calculated difference in temperature measurements is indicative of the location of the water surface.

20 Claims, 6 Drawing Sheets

(51) Int. Cl.
*G01K 3/14* (2006.01)
*H05K 1/18* (2006.01)
*H05K 5/00* (2006.01)
*H05K 5/06* (2006.01)

(52) U.S. Cl.
CPC .......... *H05K 5/0039* (2013.01); *H05K 5/064* (2013.01); *H05K 2201/10151* (2013.01)

(56) References Cited

U.S. PATENT DOCUMENTS

| | | | | |
|---|---|---|---|---|
| 4,899,584 | A * | 2/1990 | McQueen | G01F 1/698 |
| | | | | 73/204.21 |
| 6,883,246 | B1 | 4/2005 | Latham | |
| 8,180,595 | B2 * | 5/2012 | Daniels | G01D 9/005 |
| | | | | 702/187 |
| 2019/0032958 | A1 * | 1/2019 | Ohse | G01F 23/248 |

OTHER PUBLICATIONS

U.S. Appl. No. 63/164,377, filed Mar. 22, 2021, inventors David A. Mellick and Steven O. Troxel, invention entitled "Temperature Sensing Arrayal for Freeboard Detection," Navy Case No. 112,151.

"The Why and How of Freeboard Calculation of a Ship," by Team TheNavalArch, Ship Design and Construction, Aug. 18, 2020, TheNavalArch website, https://thenavalarch.com/the-why-and-how-of-freeboard-calculation-of-a-ship/, printed out on Feb. 13, 2022 (13 pages).

Don Patton, "How to Calculate a Freeboard," Gone Outdoors website, https://goneoutdoors.com/calculate-freeboard-7572041.html, printed out on Feb. 13, 2022 (3 pages).

"Freeboard (nautical)," Wikipedia, https://en.wikipedia.org/w/index.php?title=Freeboard_(nautical)&oldid=995044965, webpage (2 pages) was last edited on Dec. 18, 2020.

"Programmable Resolution 1-Wire Digital Thermometer," DS18B20, 20 pages, Maxim Integrated Products, Inc., 19-7487, Rev 6, Jul. 19 (Jul. 2019).

* cited by examiner

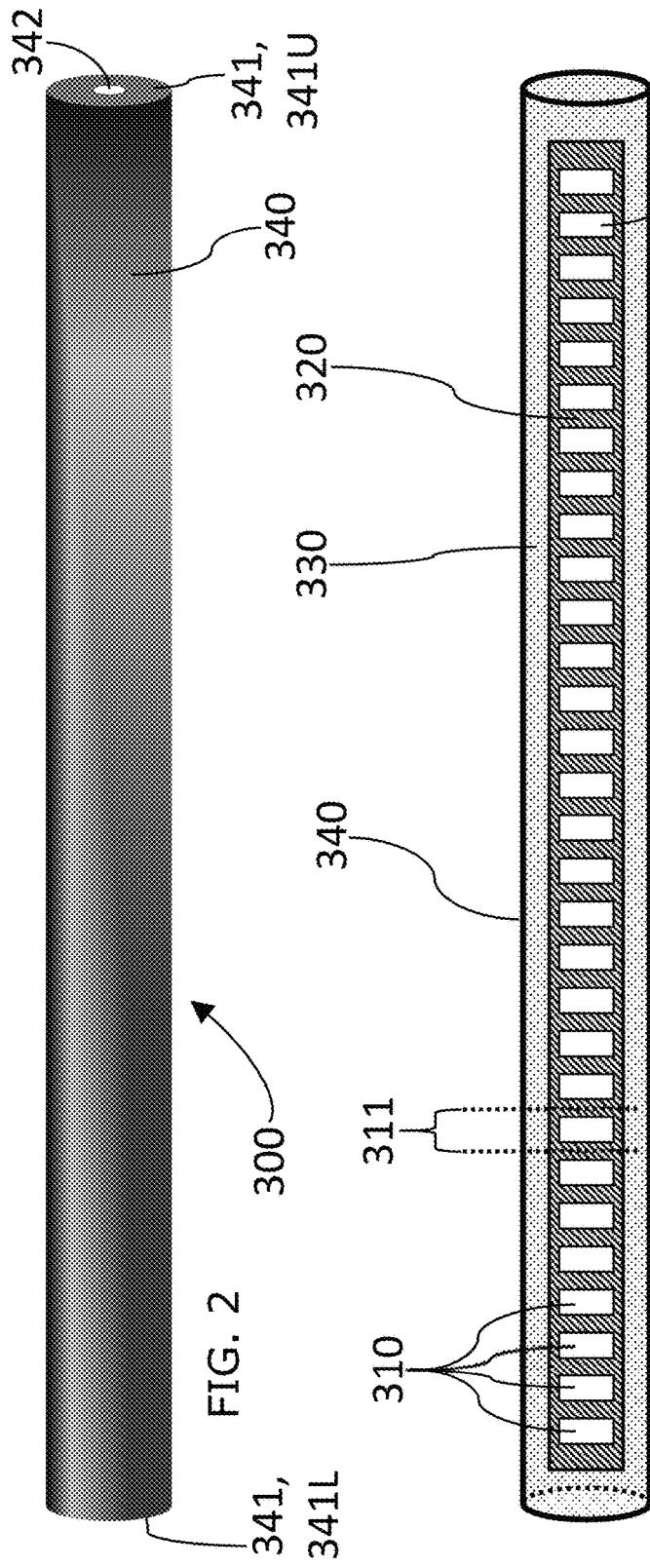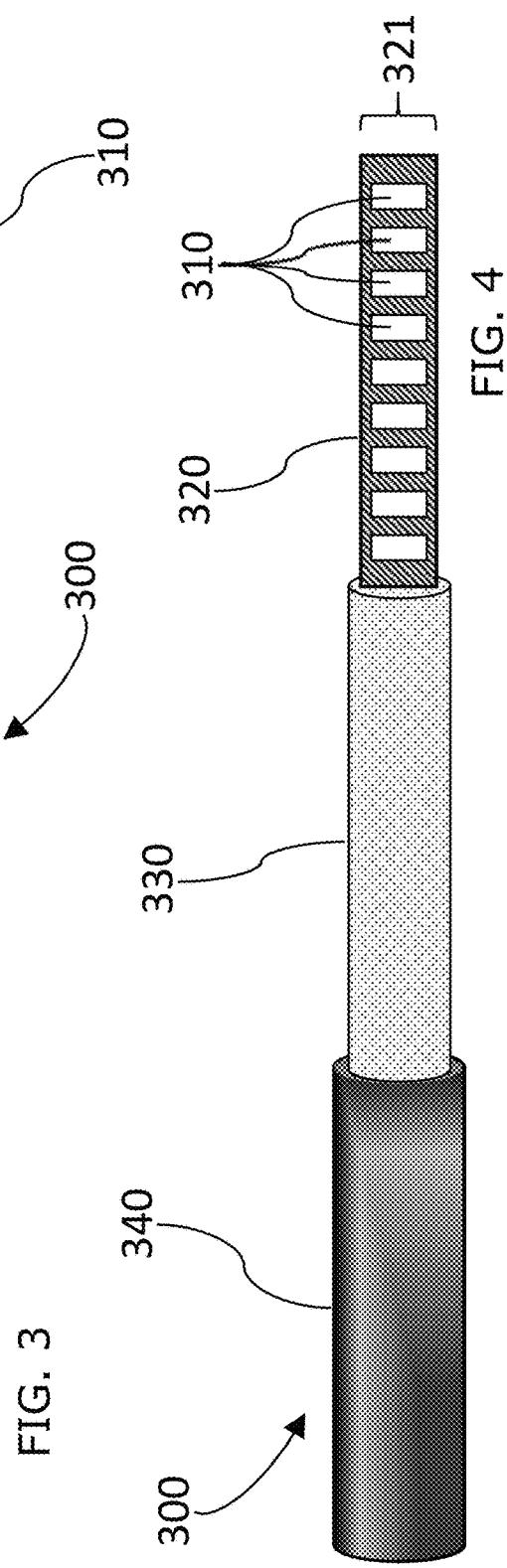

TEMPERATURE SENSING ARRAYAL FOR FREEBOARD DETECTION

STATEMENT OF GOVERNMENT INTEREST

The invention described herein was made by persons including at least one employee of the Department of the Navy who made the invention in performance of his or her official duties. The invention may be manufactured, used, and licensed by or for the Government of the United States of America for governmental purposes without payment of any royalties thereon or therefor. The Government of the United States of America has ownership rights in the invention.

BACKGROUND OF THE INVENTION

The present invention relates to the height of a marine vessel in relation to the water surface, more particularly to methods and apparatuses for determining a freeboard vertical distance of a vessel situated in water.

A freeboard sensor measures the vertical distance between a predetermined height on a vessel (e.g., ship, boat, or floating platform) and the waterline. A shallow or negatively trending freeboard value can indicate a loss of buoyancy and/or a possible water leak. The ability to monitor a vessel's freeboard is imperative for continually knowing the overall structural and seafaring integrity of the vessel. A shallow or negatively trending freeboard may indicate a loss of buoyancy as a result of a leak. An accurate freeboard reading is particularly critical during inclement weather, for instance when waves can swamp a vessel, or ice can build up causing the vessel to flip over.

Many existing technologies for freeboard sensing are prone to failure in extreme or adverse weather conditions such as freezing weather. Devices currently implemented for freeboard detection include float switches, acoustic range finders, laser range finders, and underwater pressure transducers. Float switches are not feasible for operation in cold weather, because float switches must be submerged in the water and are likely to freeze in place once they are out of the water. Acoustic and laser range finders are problematic since water can freeze on the transmitters and ice can block the intended detection path or paths. In theory, pressure transducers can be designed to measure the small static pressure differentials in freeboard changes. In practice, however, pressure transducers suffer from long term drift, and have been found to be unreliable near the water surface in situations in which wave activity and acoustic noise can cause false readings.

The above-described methods are each beset with limitations, particularly in terms of unsuitability for use in climates where freezing is to be expected. Accordingly, it is desirable to provide method and apparatus for a freeboard sensor/detector that can operate reliably in any weather. There exists a need for freeboard sensing capability that is immune to cold, acoustic noise, and wave action.

SUMMARY OF THE INVENTION

In view of the foregoing, a principal object of the present invention is to provide a better methodology for determining freeboard values with respect to marine vessels situated in water.

In accordance with exemplary practice of the present invention, an inventive electronic device is coupled with a vessel in a longitudinally vertical orientation so as to be partially in air and partially in water. The electronic device includes a tubular member and a printed circuit board assembly housed inside the tubular member, which is characterized by a tubular length. The printed circuit board assembly includes an array of temperature sensors placed at three or more equally distanced sensor locations along the tubular length. At least one temperature sensor is placed at each sensor location. A plurality of temperature differential values are calculated. Each temperature differential value corresponds to electrical signals received from at least two temperature sensors. At least one maximum temperature differential value is indicative of a freeboard location with respect to the vessel.

Exemplary inventive practice measures freeboard through use of a high resolution temperature string. An exemplary inventive freeboard sensing system can operate reliably in any weather, including freezing and other inclement weather conditions, and is immune to cold temperatures, acoustic noise, and wave dynamics. Exemplary inventive practice involves no moving parts or parts exposed to the elements that could be blocked by ice, and these and other inventive features foster imperviousness to inclement weather. Ice buildup on an inventive freeboard sensor will not impede its ability to make an accurate reading. Unlike pressure sensors, exemplary inventive sensors are not troubled by long term drift and are not susceptible to waves or acoustic noise. The present invention may be embodied, for example, as a method or an apparatus for effecting freeboard sensing or freeboard detection.

The terms "freeboard sensor" and "freeboard detector" are used interchangeably herein. Similarly, the terms "freeboard sensing" and "freeboard detection" are used interchangeably herein. The term "vessel," as used herein, broadly refers to any structure intended for use in or on water, typically such a structure that is floatable and man-made. A vessel may be any of a variety of types of vessels including but not limited to those commonly identified as ships, boats, rafts, barges, and floating platforms. By way of example, an inventive embodiment may include an air-and-water temperature array representing a small, high-resolution, 1-wire temperature system.

Applicant's freeboard sensor, as exemplarily embodied, measures the depth of a vessel from a predefined reference location (e.g., upper deck or surface), in or on the vessel, to the vessel's current waterline. A novel principle of exemplary inventive practice is that measurement, proximate the vessel, of temperature differential at the interface between the water below and the air above, can afford a solution for determining freeboard distance. Exemplary inventive freeboard detection is uniquely premised on the scientific principle that an appreciably greater difference in temperature will exist between the air and the water at the water surface—i.e., at the interface between the air immediately above the interface and the water immediately below the interface—than will exist between two proximate locations within the air or between two proximate locations within the water.

BRIEF DESCRIPTION OF THE DRAWINGS

The present invention will now be described, by way of example, with reference to the accompanying drawings, wherein like numbers indicate same or similar parts or components, and wherein:

FIGS. 2 through 4 are perspective views of an embodiment of a freeboard sensor in accordance with the present invention. FIG. 2 is a view exterior to the tubular outer structure of the inventive device. FIG. 3 is a view of the inventive device wherein the tubular outer structure is removed and the potting matrix material, printed circuit board (PCB), and temperature sensors are revealed. FIG. 4 is a tripartite view of the inventive device showing, in longitudinal sequence: (i) the tubular outer structure as in FIG. 2; (ii) the temperature sensors, circuit board, and potting matrix material, sans tubular outer structure, as in FIG. 3; and (iii) the temperature sensors and circuit board, sans potting matrix material and tubular outer structure.

FIG. 5 is a view, exterior to the tubular outer structure of the inventive device, showing one of two tube ends (e.g., end caps) of the tubular structure, the upper tube end provided with a center aperture to accommodate electrical wiring. FIG. 6 is a view of the inventive device wherein the outer tubular structure is removed and the potting matrix material, circuit board, and temperature sensors are revealed.

FIG. 9 shows two longitudinal rows of temperature sensors. FIG. 10 shows four longitudinal rows of temperature sensors. In contrast, FIG. 3 shows a single longitudinal row of temperature sensors.

DESCRIPTION OF EXEMPLARY
EMBODIMENTS OF THE INVENTION

Figure 1:
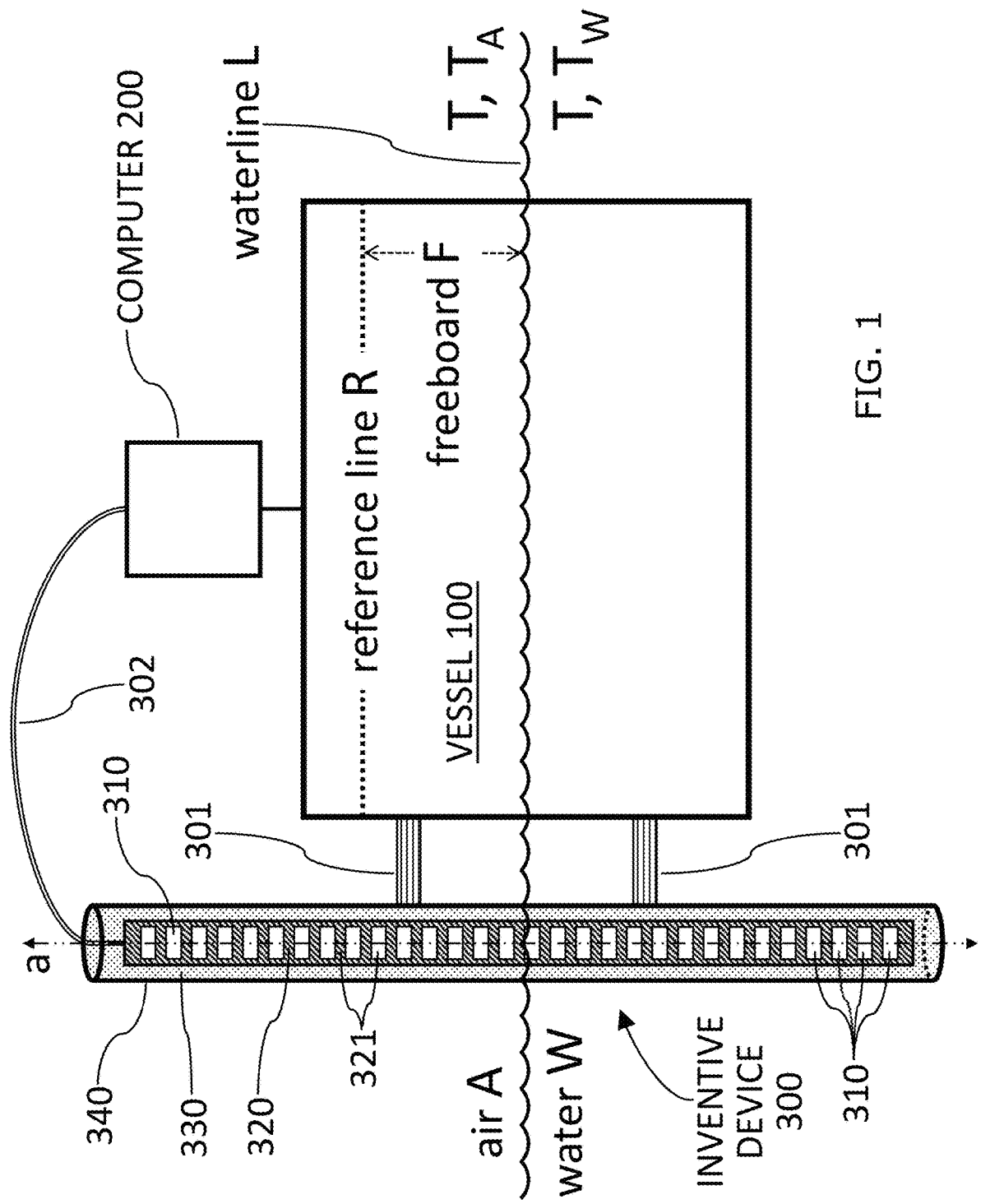
FIG. 1 is a diagram illustrating exemplary practice of freeboard sensing/detection in accordance with the present invention.

Reference is now made to FIG. 1, which schematically illustrates an example of inventive practice. Vessel 100 has an onboard computer 200 and has exteriorly attached thereto (e.g., to the hull of vessel 100) an inventive freeboard detection device 300. Vessel 100 is buoyantly situated in water W whereby an upper portion of vessel 100 is above the waterline L (i.e., located in the air A) and a lower portion of vessel 100 is below the waterline L (i.e., located in the water W). Similarly, an upper portion of inventive freeboard detection device 300 is above the waterline L (i.e., located in the air A) and a lower portion of inventive freeboard detection device 300 is below the waterline L (i.e., located in the water W).

Inventive freeboard detection device 300 measures the vertical freeboard distance F from a predefined reference line A to the vessel's current waterline L, which may be dynamically changing in accordance with time of day and changing ambient conditions. Reference line A demarcates a generally horizontal geometric plane in or on the vessel, e.g., an upper deck, level, or surface. Waterline L demarcates a generally horizontal geometric plane defined by the water W surface. Inventive freeboard detection device 300 is characterized by a geometric longitudinal axis a, and is positioned near vessel 100 so that axis a is approximately vertical and hence is approximately perpendicular to waterline L. Inventive freeboard detection device 300 is electrically connected to computer 200 either wirelessly or via one or more wires (e.g., cables) 302, and is attached to vessel 100 via one or more fasteners 301 such as including bolts, screws, clamps, clasps, brackets, and/or clips.

Still referring to FIG. 1 and also referring to FIGS. 2 through 8, inventive freeboard detection device 300 includes temperature sensors 310, a printed circuit board 320 (acronymously referred to herein as a "PCB"), potting matrix material 330 (e.g., a potting compound), and a hollow tube 340. Printed circuit board assembly 321 (acronymously referred to herein as a "PCBA" or "PCA" or "PCB assembly") is a combination of elements including the arrayed temperature sensors 310 and the long and narrow printed circuit board 320. The printed circuit board assembly 321 is encapsulated in a watertight potting material 330 (e.g., polyurethane, urethane, epoxy, or silicone) that fills a rigid protective tube 340 (e.g., made of metal or composite). For instance, printed circuit board assembly 321 is placed within tube 340, and potting compound 330 is introduced into tube 340 to encapsulate printed circuit board assembly 321 inside tube 340.

As shown in FIGS. 1 and 3, a single-row longitudinal array of 1-wire temperature sensors 310 is electrically connectively mounted upon an elongate circuit board 320 and is aligned and evenly spaced apart along axis a. Exemplary inventive embodiments implement temperature sensors 310 that are all same as or similar to each other; however, the present invention can be practiced wherein two or more temperature sensors 310 differ from each other in terms of type or size or one or more other respects. Temperature sensors 310 are electrical/electronic components that are supported and connected by printed circuit board 320. For instance, electrically conductive solder may be used to hold temperature sensors 310 in place and electrically connect them to printed circuit board 320.

According to frequent inventive practice, inventive freeboard detection device 300 is positioned in and above the water W so that the length of circuit board assembly 321 (that is, the length of printed circuit board 320 having temperature sensors 310 associated therewith) extends from the air A at a location therein several inches above the predefined freeboard reference location R (e.g., a deck or other upper surface) of vessel 100, to the water W at a location therein several inches below the lowest expected waterline L. The length of inventive freeboard detection device 300 should thus be sufficient to enable measurements of the respective temperatures of the air and the water in a vertical sensitive range that at least covers all reasonably predictable ambient conditions. Inventive freeboard detection device 300 is installed onto vessel 100 so as to extend in a vertical direction in both the air A and the water W, thereby being capable of sensing the temperature of both the air A and the water W. Tube 340 should be near vessel 100 but horizontally offset from vessel 100 a sufficient distance (e.g., a short distance of several inches), using fasteners 301 (such as clamps), so that the temperature of the vessel 100 itself does not affect the sensing results.

Figure 5:
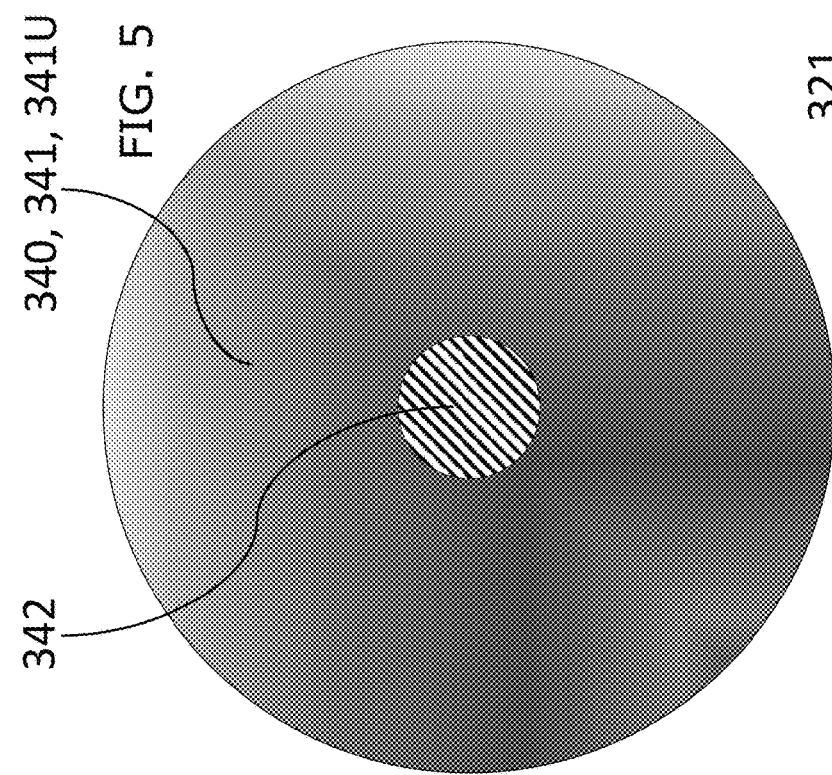
FIGS. 5 and 6 are longitudinal end views of the inventive embodiment shown in FIGS. 2 through 4.
Figure 6:
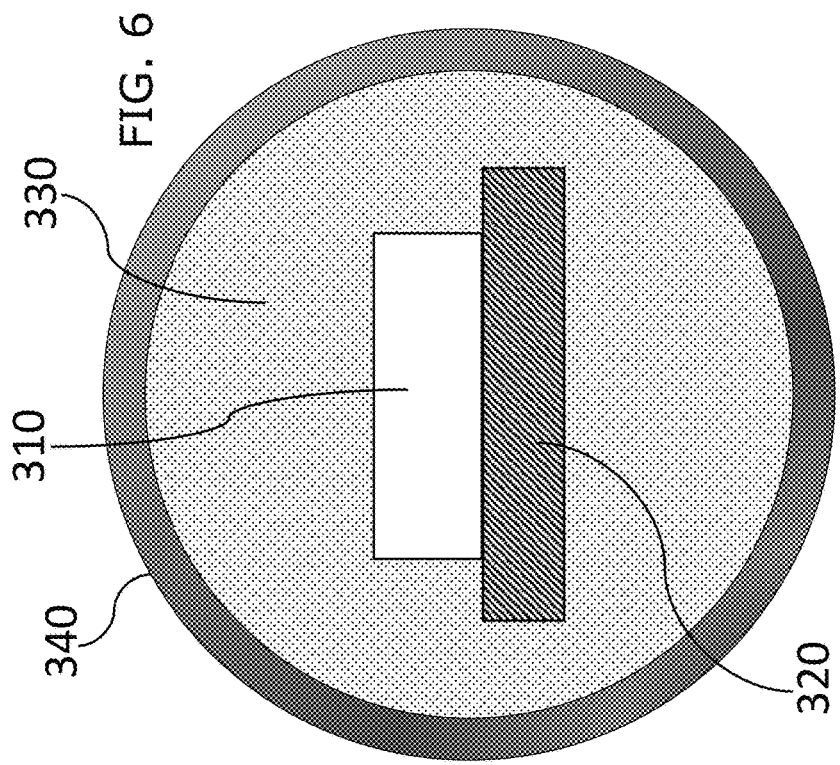
Figure 7:
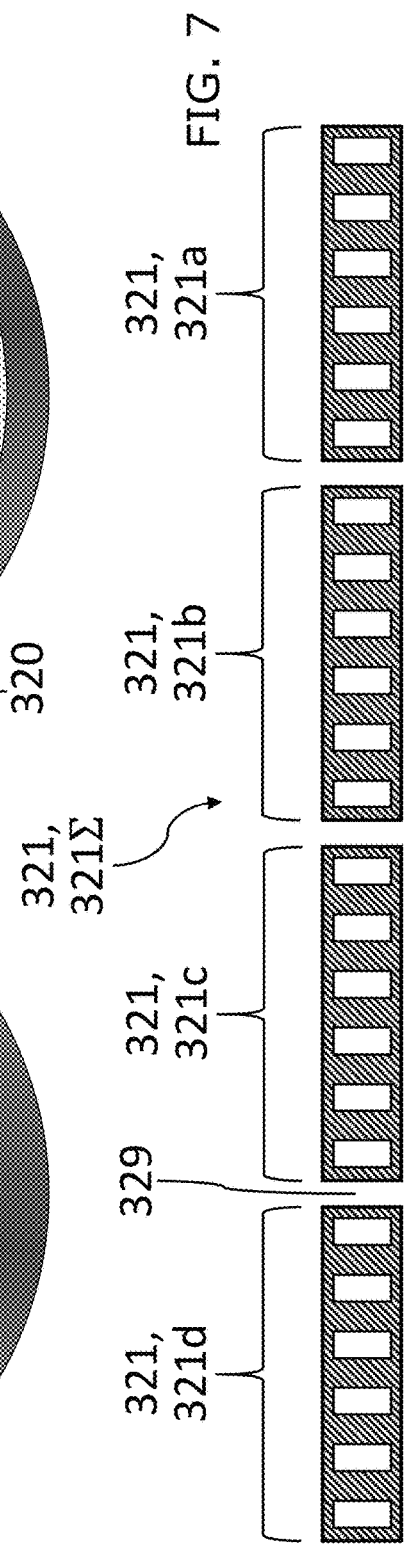
FIG. 7 is a plan view illustrating an example of inventive practice wherein a plurality of circuit boards, each having temperature sensors associated therewith, are mechanically attached and electrically connected at respective longitudinal ends to form a unified circuit board having the aggregate temperature sensors associated therewith.
Figure 8:
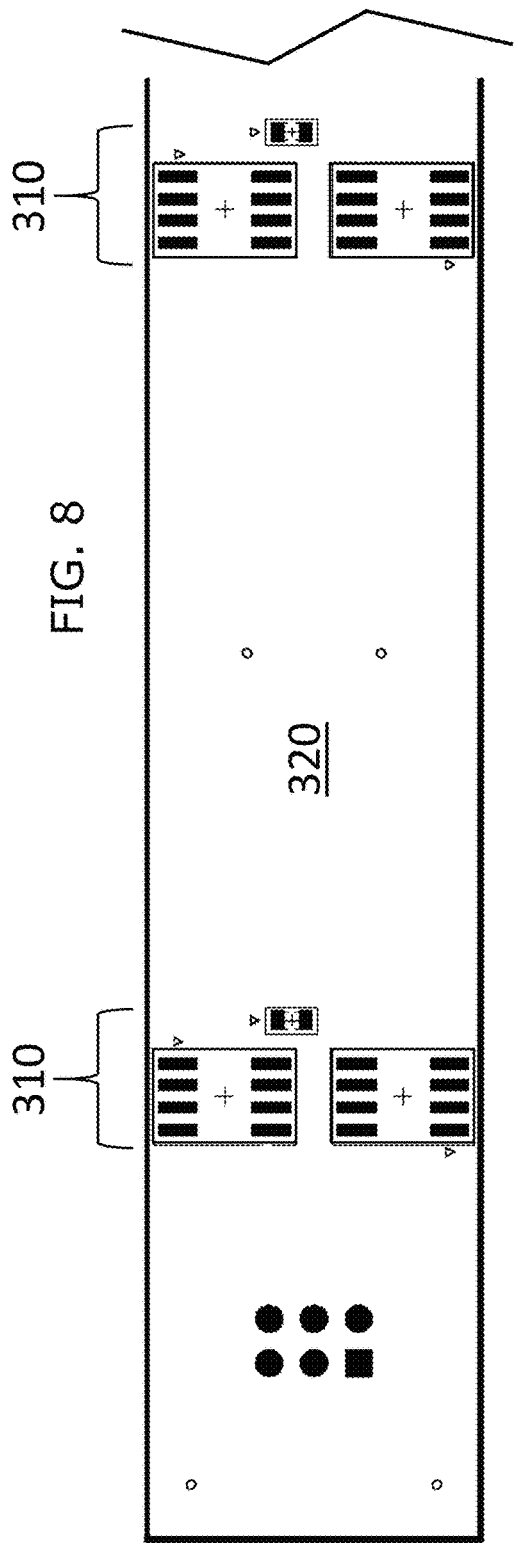
FIG. 8 is a plan view, partial and enlarged, of a circuit board having temperature sensors associated therewith such as less detailedly depicted in some other figures herein. Two temperature sensors are shown in FIG. 8.

According to some examples of inventive practice of a circuit board assembly 321, at least three 1-wire temperature sensors 310 are arrayed so as to be spaced evenly apart along the length of circuit board 320. The spacing of temperature sensors 320 may be selected in accordance with specific application requirements. According to many inventive systems a two-inch spacing between sensors will provide sufficient resolution and accuracy. Depending on the inventive embodiment, circuit board assembly 321 may include one PCB 320 member, or plural PCB 320 members that are integrated to form a single PCB 320. That is, as further discussed hereinbelow, additional circuit boards can be connected, end-to-end, in a serial fashion to obtain the overall circuit board length needed for a particular application of an inventive sensor array. The circuit board assembly 321 is then housed and potted in a narrow round tube 340, such as 1" PVC pipe. As shown in FIGS. 2 and 5, tube 340 has two tube ends 341, either or both of which may be removable. Upper tube end 341U has a center opening 342 for permitting passage therethrough of wiring 302, which connects circuit board assembly 321 and computer 200.

According to exemplary inventive practice, detection of the current freeboard value is obtained by locating where in the sensor array the largest temperature differential exists between two adjacent temperature sensors, thereby indicating the air-water interface L. The magnitude of this temperature differential may vary throughout the day. It is possible that the air temperature and the water temperature will be equal at certain points throughout the day; at such times some inventive embodiments may effectuate additional processing steps, such as involving more sophisticated algorithmic calculations, to find the air-water interface L. The inventive methodology of freeboard detection is not only capable of high resolution measurements but, most critically, is not impacted by freezing weather and ice build-up.

Generally speaking, manufacture of a printed circuit board is limited in terms of size. Most commercially available printed circuit boards do not exceed about two feet in length. Accordingly, in practicing the present invention, it may be propitious to "string together," end-to-end, two or more printed circuit boards 320 to form an overall printed circuit board 320 describing the aggregate lengths of the individual circuit boards 320. For instance, as shown by way of example in FIG. 7, a larger printed circuit assembly unit 3212 includes four smaller printed circuit assembly components, viz., 321a, 321b, 321c, and 321d, which are serially connected along their respective lengths to obtain the requisite measurement length for a given application. Sequential pairs of printed circuit assembly components are electrically and mechanically connected at corresponding end-to-end junctions 329. Once the unified printed circuit assembly 3212 is made having the desired length, it is enclosed in the tube 340. When placed in tube 340 and encapsulated in potting material 330, the length of unified printed circuit assembly 3212 coincides with the axial length of tube 40.

Figure 9:
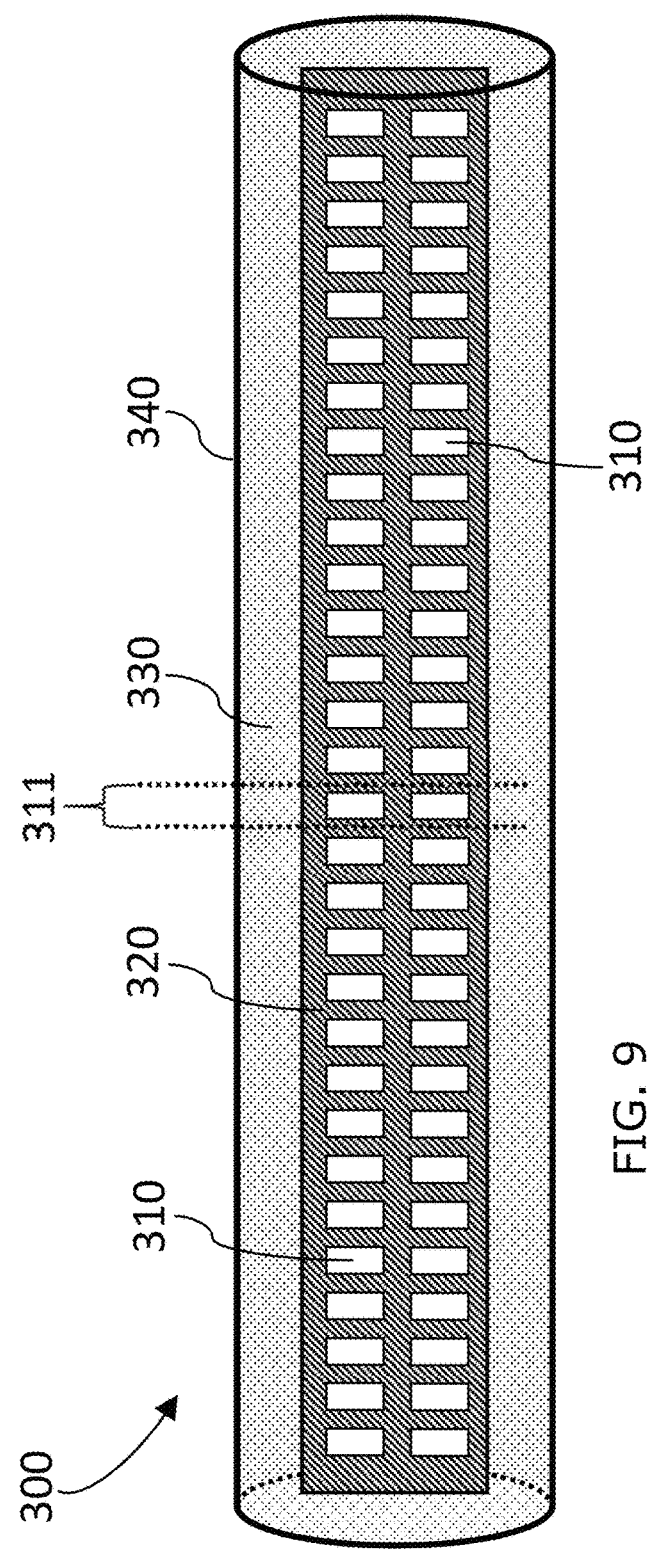
FIGS. 9 and 10 are perspective views, similar to FIG. 3, of a circuit board having associated therewith a plural-row longitudinal array of temperature sensors.
Figure 10:
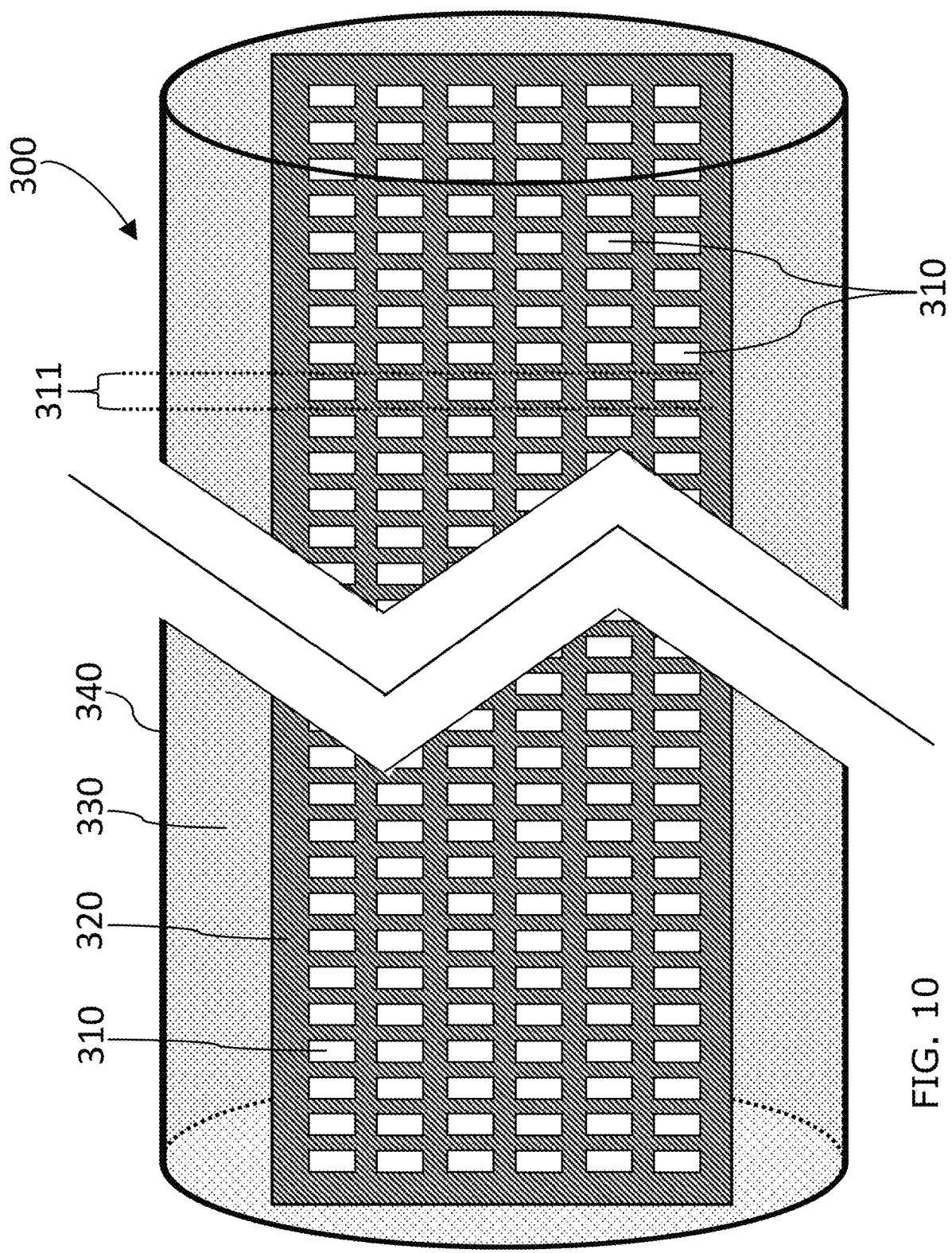

FIGS. 1, 3, 4, and 7 each depict a single-row linear arrayal of temperature sensors 310. With reference to FIGS. 9 and 10, plural temperature sensors may be implemented at each sensor location 311 along the vertical length of the array in order to provide redundancy or greater accuracy. By way of example, FIG. 9 depicts a double-row linear arrayal of sensors 310; FIG. 10 depicts a sextuple-row linear arrayal of sensors 310. As shown in FIG. 3, each sensor longitudinal position 311 in the array has one sensor 310. As shown in FIG. 9, each sensor longitudinal position 311 in the array has two crosswise adjacent sensors 310. As shown in FIG. 10, each sensor longitudinal position 311 in the array has six crosswise adjacent sensors 310.

Figure 11:
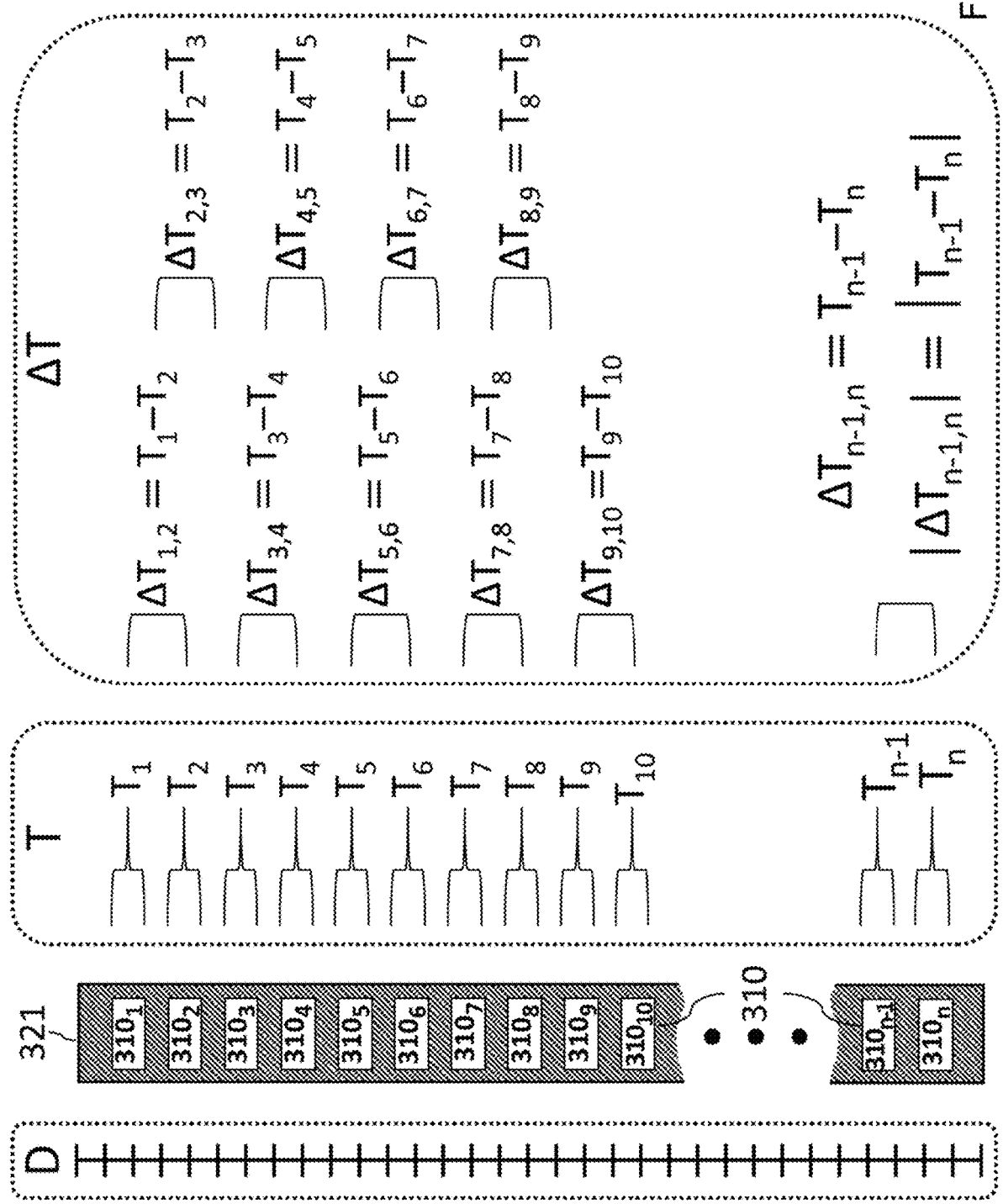
FIG. 11 is a diagram illustrating an example of temperature-sensory computer logic in accordance with the present invention.

Still referring to FIG. 1 and also referring to FIG. 11, according to exemplary inventive practice the freeboard value F is obtained by looking for a large temperature differential $\Delta T$ between the air A and the water W, thereby determining the location of the air-water interface (i.e., water surface or waterline) L. Exemplary inventive embodiments receive and process sensory data on a continuous basis, every minute of every day, in order to remain current in monitoring the ever-changing freeboard values F. As shown by way of example in FIG. 11, the vertical distance D correlates to the corresponding positions of temperature sensors 310, each of which senses an ambient temperature T. The distances values D corresponding to all of the temperature sensor 320 positions are initial input in computer 200 database for purposes of processing the data. For example, let us assume that two vertically consecutive temperature sensors 310 measure temperatures $T_{n-1}$ and $T_n$, respectively. Then the difference between temperature $T_{n-1}$ and temperature $T_n$ is $\Delta T$, which equals $(T_{n-1}-T_n)$. Looked at in terms of absolute values, $|\Delta T|$ equals $|T_{n-1}-T_n|$. Each pair of vertically adjacent sensors 310 has associated therewith a temperature differential $\Delta T$.

Taking into consideration all of the calculated values of temperature differential $\Delta T$, the largest absolute-value temperature differential $|\Delta T|$ represents the location of the waterline L, i.e., the interface between the water (immediately below the interface) and the air (immediately above the interface). Accordingly, waterline L is located intermediate (e.g., midway between) the respective positions of the pair of vertically adjacent temperature sensors 320 that registers the greatest absolute-value temperature differential $|\Delta T|$. This is but one example of the various forms of algorithmic logic that can be brought to bear on the sensed temperature values in accordance with the present invention. Additionally or alternatively, inventive computer logic may include comparisons of temperature sensory readings or temperature differentials with historical data, or estimations of temperature values or differentials based on least squares fit or other curve-fitting analysis. In the light of the instant disclosure, the ordinarily skilled artisan with appreciate multifarious known mathematical techniques that may be suitable for processing temperature-related and distance-related data in accordance with the present invention.

Inventive computer logic may consider temperature differentials between two vertically adjacent temperature sensors 320, and/or temperature differentials between two vertically nonadjacent temperature sensor 320. Inventive computer logic may be applied to single-row temperature sensor 320 arrays as well as to multi-row temperature sensor 320 arrays. For instance, in the case of a plural-row sensor 320 arrayal such as shown for example in FIGS. 8 and 10, each longitudinal sensor position 311 along the length of the array will give plural temperature signals corresponding to the individual temperature sensors at that longitudinal position 311. The plural sensed temperature values at a given longitudinal position may be variously considered such as by averaging or applying other mathematical techniques.

According to frequent inventive practice, temperature differences of only 0.1° C. can be detected because of the respective high sensitivities of the temperature sensors 310; therefore, a 1° C. temperature differential may be considered large and more than adequate for determining the air-water interface freeboard location, viz., waterline L. Under typical environmental conditions, throughout the day the air temperature will tend to swing more than a few degrees and at a faster rate of change as compared with the water temperature. The water temperature, in turn, will trend very slowly and generally in accordance with the average daily and seasonal temperatures. Normally in many marine settings, a "crossing" of air temperature and water temperature values, where the water temperature and the air temperature are equal, will occur twice daily. However, these time periods of temperature equivalence are small, and the present invention may be embodied so as to be capable of resolving the freeboard under such circumstances by more complicated data analysis.

The present invention, which is disclosed herein, is not to be limited by the embodiments described or illustrated herein, which are given by way of example and not of limitation. Other embodiments of the present invention will be apparent to those skilled in the art from consideration of the instant disclosure or from practice of the present invention. Various omissions, modifications, and changes to the principles disclosed herein may be made by one skilled in the art without departing from the true scope and spirit of the present invention, which is indicated by the following claims.

What is claimed is:

1. A freeboard sensing system comprising a printed circuit board assembly, a tubular member characterized by a tubular length and housing said printed circuit board assembly, and a computer having computer code characterized by computer program logic for determining the freeboard of a vessel, said printed circuit board assembly including an array of temperature sensors placed at at least three equally distanced sensor locations along said tubular length, at least one said temperature sensor placed at each said sensor location, wherein when said tube is communicative with said computer and is coupled with said vessel in a longitudinally vertical orientation so as to be partially in air and partially in water, said computer is capable of executing said computer code in accordance with said computer program logic wherein said computer determines a freeboard location along said tubular length, said determining of said freeboard location including finding a plurality of temperature differential values, each said temperature differential value corresponding to signals received from at least two said temperature sensors, and selecting at least one maximum said temperature differential value as indicative of said freeboard location.

2. The freeboard sensing system of claim 1 wherein one said temperature sensor is placed at each said sensor location.

3. The freeboard sensing system of claim 1 wherein at least two said temperature sensors are placed at each said sensor location.

4. The freeboard sensing system of claim 1 wherein at least one said temperature differential value corresponds to signals received from two longitudinally consecutive said temperature sensors.

5. The freeboard sensing system of claim 1 wherein at least one said temperature differential value corresponds to signals received from two longitudinally nonconsecutive said temperature sensors.

6. The freeboard sensing system of claim 1 further comprising a potting compound, wherein said printed circuit board assembly:
includes said temperature sensors and at least one printed circuit board, said temperature sensors electronically unified with said at least one printed circuit board;
is encapsulated by said potting compound inside said tubular member.

7. The freeboard sensing system of claim 1 wherein said potting compound is a material selected from the group consisting of polyurethane, urethane, epoxy, and silicone.

8. A method for determining a freeboard of a vessel, the method comprising:
coupling an electronic device with a vessel in a longitudinally vertical orientation so as to be partially in air and partially in water, said electronic device including a tubular member and a printed circuit board assembly housed inside said tubular member, said tubular member characterized by a tubular length, said printed circuit board assembly including an array of temperature sensors placed at at least three equally distanced sensor locations along said tubular length, at least one said temperature sensor placed at each said sensor location;
calculating a plurality of temperature differential values, each said temperature differential value corresponding to electrical signals received from at least two said temperature sensors;
selecting at least one maximum said temperature differential value as indicative of a freeboard location with respect to said vessel.

9. The method for determining a freeboard as recited in claim 8 wherein the method is computer-implemented, said calculating of said temperature differential values and said selecting of at least one maximum said temperature differential value including using a computer.

10. The method for determining a freeboard as recited in claim 8, wherein one said temperature sensor is placed at each said sensor location.

11. The method for determining a freeboard as recited in claim 8, wherein at least one said temperature differential value corresponds to signals received from two longitudinally consecutive said temperature sensors.

12. The method for determining a freeboard as recited in claim 8, wherein at least one said temperature differential value corresponds to signals received from two longitudinally nonconsecutive said temperature sensors.

13. The method for determining a freeboard as recited in claim 8, wherein:
said electronic device includes a potting compound;
said printed circuit board assembly includes said temperature sensors and at least one printed circuit board;
said temperature sensors are electronically unified with said at least one printed circuit board;
said temperature sensors are encapsulated by said potting compound inside said tubular member.

14. An apparatus for freeboard detection, the apparatus comprising a printed circuit board assembly, a potting material, a tube, and a computer, said tube containing said potting material and said printed circuit board assembly, said printed circuit board assembly encapsulated in said potting material, said printing circuit board assembly including a printed circuit board characterized by a board length and at least three temperature sensors associated with said printed circuit board, said at least three temperature sensors aligned with and evenly spaced apart from each other along said board length, said computer having computer code characterized by computer program logic for determining the freeboard of a vessel, wherein said tube that contains said potting material and said printed circuit board assembly is attached to said vessel and is situated partially in air and partially in water whereby said at least three temperature sensors are aligned in an approximately vertical direction, said computer code being executable by said computer so that, in accordance with said computer program logic, said computer processes temperature sensory signals received from said at least three temperature sensors, said processing of said temperature sensory signals including calculating at least two temperature measurement differentials, each said temperature measurement differential representing a difference between two temperature measurements respectively corresponding to two said temperature sensors.

15. The apparatus for freeboard detection as recited in claim 14, wherein each said temperature measurement differential represents a difference between two said temperature measurements respectively corresponding to two said temperature sensors that are adjacent to each other along said board length.

16. The apparatus for freeboard detection as recited in claim 14, wherein at least one said temperature measurement differential represents a difference between two said temperature measurements respectively corresponding to two said temperature sensors that are adjacent to each other along said board length.

17. The apparatus for freeboard detection as recited in claim 14 wherein at least one said temperature measurement differential represents a difference between two said temperature measurements respectively corresponding to two said temperature sensors that are not adjacent to each other along said board length.

18. The apparatus for freeboard detection as recited in claim 14, wherein at least one said temperature measurement differential represents a difference between two said temperature measurements respectively corresponding to two said temperature sensors that are adjacent to each other along said board length.

19. The apparatus for freeboard detection as recited in claim 14, wherein said potting material is a material selected from the group consisting of polyurethane, urethane, epoxy, and silicone.

20. The apparatus for freeboard detection as recited in claim 14, wherein said tube is made of a material selected from the group consisting of metal and composite.

* * * * *